(12) United States Patent
Green et al.

(10) Patent No.: US 8,101,298 B2
(45) Date of Patent: Jan. 24, 2012

(54) METHOD OF FABRICATING FIBRES COMPOSED OF SILICON OR A SILICON-BASED MATERIAL AND THEIR USE IN LITHIUM RECHARGEABLE BATTERIES

(75) Inventors: Mino Green, London (GB); Feng-Ming Liu, Abingdon (GB)

(73) Assignee: Nexeon Ltd., Oxfordshire (GB)

( * ) Notice: Subject to any disclaimer, the term of this patent is extended or adjusted under 35 U.S.C. 154(b) by 69 days.

(21) Appl. No.: 12/161,126

(22) PCT Filed: Jan. 23, 2007

(86) PCT No.: PCT/GB2007/000211
§ 371 (c)(1),
(2), (4) Date: Feb. 25, 2010

(87) PCT Pub. No.: WO2007/083155
PCT Pub. Date: Jul. 26, 2007

(65) Prior Publication Data
US 2010/0151324 A1    Jun. 17, 2010

(30) Foreign Application Priority Data

Jan. 23, 2006 (GB) .................................. 0601319.7

(51) Int. Cl.
*H01M 4/13* (2010.01)
*H01M 4/88* (2006.01)
(52) U.S. Cl. ...................... 429/218.1; 429/209; 502/101
(58) Field of Classification Search ............... 429/218.1, 429/209; 502/101
See application file for complete search history.

(56) References Cited

U.S. PATENT DOCUMENTS

| | | | |
|---|---|---|---|
| 3,351,445 | A | 11/1967 | Fielder et al. |
| 4,002,541 | A | 1/1977 | Streander |
| 4,436,796 | A | 3/1984 | Huggins et al. |
| 4,950,566 | A | 8/1990 | Huggins et al. |
| 5,262,021 | A | 11/1993 | Lehmann et al. |
| 5,907,899 | A | 6/1999 | Dahn et al. |
| 6,022,640 | A | 2/2000 | Takada et al. |
| 6,042,969 | A | 3/2000 | Yamada et al. |
| 6,063,995 | A | 5/2000 | Bohland et al. |
| 6,235,427 | B1 | 5/2001 | Idota et al. |
| 6,296,969 | B1 | 10/2001 | Yano et al. |
| 6,334,939 | B1 | 1/2002 | Zhou et al. |
| 6,337,156 | B1 | 1/2002 | Narang et al. |

(Continued)

FOREIGN PATENT DOCUMENTS

DE   103 47 570 A1   5/2005

(Continued)

OTHER PUBLICATIONS

Badel et al., "Formation of Ordered Pore Arrays at the Nanoscale by Electrochemical Etching of N-Type Silicon", Superlattices and Microstructures, 36 (2004) 245-253.

(Continued)

*Primary Examiner* — Helen O Conley
(74) *Attorney, Agent, or Firm* — Fay Sharpe LLP

(57) ABSTRACT

A method of fabricating fibres of silicon or silicon-based material comprises the steps of etching pillars on a substrate and detaching them. A battery anode can then be created by using the fibres as the active material in a composite anode electrode.

20 Claims, 3 Drawing Sheets

U.S. PATENT DOCUMENTS

| | | |
|---|---|---|
| 6,353,317 B1 | 3/2002 | Green et al. |
| 6,589,696 B2 | 7/2003 | Matsubara et al. |
| 6,605,386 B1 | 8/2003 | Kasamatsu et al. |
| 6,887,511 B1 | 5/2005 | Shima et al. |
| 6,916,679 B2 | 7/2005 | Snyder et al. |
| 7,033,936 B1 | 4/2006 | Green |
| 7,051,945 B2 * | 5/2006 | Empedocles et al. ......... 235/492 |
| 7,070,632 B1 | 7/2006 | Visco et al. |
| 7,094,499 B1 | 8/2006 | Hung |
| 7,147,894 B2 | 12/2006 | Zhou et al. |
| 7,192,673 B1 | 3/2007 | Ikeda et al. |
| 7,311,999 B2 | 12/2007 | Kawase et al. |
| 7,318,982 B2 | 1/2008 | Gozdz et al. |
| 7,348,102 B2 | 3/2008 | Li et al. |
| 7,358,011 B2 | 4/2008 | Fukuoka et al. |
| 7,378,041 B2 | 5/2008 | Asao et al. |
| 7,425,285 B2 | 9/2008 | Asao et al. |
| 2001/0023986 A1 | 9/2001 | Mancevski |
| 2003/0135989 A1 | 7/2003 | Huggins et al. |
| 2004/0072067 A1 | 4/2004 | Minami et al. |
| 2004/0126659 A1 | 7/2004 | Graetz et al. |
| 2004/0185346 A1 | 9/2004 | Takeuchi et al. |
| 2004/0197660 A1 | 10/2004 | Sheem et al. |
| 2004/0224231 A1 | 11/2004 | Fujimoto et al. |
| 2004/0241548 A1 | 12/2004 | Nakamoto et al. |
| 2005/0042515 A1 | 2/2005 | Hwang et al. |
| 2005/0079420 A1 | 4/2005 | Cho et al. |
| 2005/0118503 A1 | 6/2005 | Honda et al. |
| 2005/0191550 A1 | 9/2005 | Satoh et al. |
| 2005/0193800 A1 | 9/2005 | DeBoer et al. |
| 2005/0214644 A1 | 9/2005 | Aramata et al. |
| 2006/0019115 A1 | 1/2006 | Wang et al. |
| 2006/0019168 A1 | 1/2006 | Li et al. |
| 2006/0024582 A1 | 2/2006 | Li et al. |
| 2006/0057463 A1 | 3/2006 | Gao et al. |
| 2006/0088767 A1 | 4/2006 | Li et al. |
| 2006/0097691 A1 | 5/2006 | Green |
| 2006/0134516 A1 | 6/2006 | Im et al. |
| 2006/0134518 A1 | 6/2006 | Kogetsu et al. |
| 2006/0147800 A1 | 7/2006 | Sato et al. |
| 2006/0154071 A1 | 7/2006 | Homma et al. |
| 2006/0166093 A1 | 7/2006 | Zaghib et al. |
| 2006/0175704 A1 | 8/2006 | Shimizu et al. |
| 2006/0257307 A1 | 11/2006 | Yang |
| 2006/0263687 A1 | 11/2006 | Leitner et al. |
| 2006/0275663 A1 | 12/2006 | Matsuno et al. |
| 2006/0275668 A1 | 12/2006 | Peres et al. |
| 2006/0286448 A1 | 12/2006 | Snyder et al. |
| 2007/0031733 A1 | 2/2007 | Kogetsu et al. |
| 2007/0059598 A1 | 3/2007 | Yang |
| 2007/0087268 A1 | 4/2007 | Kim et al. |
| 2007/0099084 A1 | 5/2007 | Huang et al. |
| 2007/0099085 A1 | 5/2007 | Choi et al. |
| 2007/0105017 A1 | 5/2007 | Kawase et al. |
| 2007/0117018 A1 | 5/2007 | Huggins |
| 2007/0122702 A1 | 5/2007 | Sung et al. |
| 2007/0148544 A1 | 6/2007 | Le |
| 2007/0172732 A1 | 7/2007 | Jung et al. |
| 2007/0184345 A1 | 8/2007 | Neudecker et al. |
| 2007/0190413 A1 | 8/2007 | Lee et al. |
| 2007/0202395 A1 | 8/2007 | Snyder et al. |
| 2007/0207080 A1 | 9/2007 | Yang |
| 2007/0207385 A1 | 9/2007 | Liu et al. |
| 2007/0209584 A1 | 9/2007 | Kalynushkin et al. |
| 2007/0218366 A1 | 9/2007 | Kalynushkin et al. |
| 2007/0224508 A1 | 9/2007 | Aramata et al. |
| 2007/0224513 A1 | 9/2007 | Kalynushkin et al. |
| 2007/0238021 A1 | 10/2007 | Liu et al. |
| 2007/0243469 A1 | 10/2007 | Kim et al. |
| 2007/0264564 A1 | 11/2007 | Johnson et al. |
| 2007/0264574 A1 | 11/2007 | Kim et al. |
| 2007/0269718 A1 | 11/2007 | Krause et al. |
| 2007/0277370 A1 | 12/2007 | Kalynushkin et al. |
| 2008/0003496 A1 | 1/2008 | Neudecker et al. |
| 2008/0003503 A1 | 1/2008 | Kawakami et al. |
| 2008/0020281 A1 | 1/2008 | Kogetsu et al. |
| 2008/0038638 A1 | 2/2008 | Zhang et al. |
| 2008/0090149 A1 | 4/2008 | Sano et al. |
| 2008/0096110 A1 | 4/2008 | Bito et al. |
| 2008/0107967 A1 | 5/2008 | Liu et al. |
| 2008/0113271 A1 | 5/2008 | Ueda et al. |
| 2008/0118834 A1 | 5/2008 | Yew et al. |
| 2008/0124631 A1 | 5/2008 | Fukui et al. |
| 2008/0131782 A1 | 6/2008 | Hagiwara et al. |
| 2008/0138710 A1 | 6/2008 | Liaw et al. |
| 2008/0138716 A1 | 6/2008 | Iwama et al. |
| 2008/0145752 A1 | 6/2008 | Hirose et al. |
| 2008/0145759 A1 | 6/2008 | Sung et al. |
| 2008/0160415 A1 | 7/2008 | Wakita et al. |
| 2008/0176139 A1 | 7/2008 | White et al. |
| 2008/0206631 A1 | 8/2008 | Christensen et al. |
| 2008/0206641 A1 | 8/2008 | Christensen et al. |
| 2008/0233479 A1 | 9/2008 | Sung et al. |
| 2008/0233480 A1 | 9/2008 | Sung et al. |
| 2008/0248250 A1 | 10/2008 | Flemming et al. |
| 2008/0261112 A1 | 10/2008 | Nagata et al. |

FOREIGN PATENT DOCUMENTS

| | | |
|---|---|---|
| EP | 0 281 115 | 9/1988 |
| EP | 0 820 110 A2 | 1/1998 |
| EP | 1 011 160 A1 | 6/2000 |
| EP | 0 936 687 B1 | 12/2001 |
| EP | 1 231 653 A1 | 8/2002 |
| EP | 1 231 654 A1 | 8/2002 |
| EP | 1 258 937 A1 | 11/2002 |
| EP | 1 083 614 B1 | 5/2003 |
| EP | 1 313 158 A2 | 5/2003 |
| EP | 1 335 438 A1 | 8/2003 |
| EP | 1 289 045 B1 | 3/2006 |
| EP | 1 657 769 A1 | 5/2006 |
| EP | 1 850 409 A1 | 10/2007 |
| EP | 1 771 899 B1 | 2/2008 |
| EP | 1 657 768 B1 | 5/2008 |
| FR | 2 885 913 B1 | 8/2007 |
| GB | 980513 | 1/1965 |
| GB | 2 395 059 A | 5/2004 |
| JP | 6-283156 | 10/1994 |
| JP | 10-83817 | 3/1998 |
| JP | 10-199524 | 7/1998 |
| JP | 2000-3727 | 1/2000 |
| JP | 2000-173594 | 6/2000 |
| JP | 2001-291514 | 10/2001 |
| JP | 2002-279974 A | 9/2002 |
| JP | 2002-313319 A | 10/2002 |
| JP | 2003-017040 | 1/2003 |
| JP | 2003-168426 | 6/2003 |
| JP | 2004-71305 | 3/2004 |
| JP | 2004-281317 | 10/2004 |
| JP | 2004-296386 A | 10/2004 |
| JP | 2004-533699 A | 11/2004 |
| JP | 2006-505901 A | 2/2006 |
| JP | 2006-276214 A | 10/2006 |
| JP | 2006-290938 A | 10/2006 |
| JP | 2006-335410 A | 12/2006 |
| JP | 2007-165079 A | 6/2007 |
| NL | 1015956 | 8/2000 |
| SU | 471402 | 5/1975 |
| SU | 544019 | 1/1977 |
| WO | WO 99/33129 | 7/1999 |
| WO | WO 01/13414 A1 | 2/2001 |
| WO | WO 01/35473 A1 | 5/2001 |
| WO | WO 01/96847 A1 | 12/2001 |
| WO | WO 02/25356 A2 | 3/2002 |
| WO | WO 02/47185 A2 | 6/2002 |
| WO | WO 03/063271 A1 | 7/2003 |
| WO | WO 03/075372 A2 | 9/2003 |
| WO | WO 2004/042851 A2 | 5/2004 |
| WO | WO 2004/052489 A2 | 6/2004 |
| WO | WO 2004/083490 A2 | 9/2004 |
| WO | WO 2005/119753 A2 | 12/2005 |
| WO | WO 2006/067891 A1 | 6/2006 |
| WO | WO 2006/073427 A2 | 7/2006 |
| WO | WO 2006/120332 A2 | 11/2006 |
| WO | WO 2007/044315 A1 | 4/2007 |
| WO | WO 2007/083152 | 7/2007 |
| WO | WO 2007/083155 | 7/2007 |
| WO | WO 2007/083155 A1 | 7/2007 |

| | | |
|---|---|---|
| WO | WO 2007/114168 A1 | 10/2007 |
| WO | WO 2008/029888 A1 | 3/2008 |
| WO | WO 2008/044683 A1 | 4/2008 |
| WO | WO 2008/072460 A1 | 6/2008 |
| WO | WO 2009/010758 | 1/2009 |
| WO | WO 2009/026466 | 2/2009 |
| WO | WO 2009/128800 | 10/2009 |

OTHER PUBLICATIONS

Beaulieu et al., "Colossal Reversible Volume Changes in Lithium Alloys", Electrochemical and Solid-State Letters, 4 (9) (2001) A137-A140.

Beaulieu et al., "Reaction of Li with Grain-Boundary Atoms in Nanostructured Compounds", Journal of The Electrochemical Society, 147 (9) (2000) 3206-3212.

Besenhard et al., "Will Advanced Lithium-Alloy Anodes Have a Chance in Lithium-Ion Batteries?", Journal of Power Sources, 68 (1997) 87-90.

Boukamp et al., "All-Solid Lithium Electrodes with Mixed-Conductor Matrix", J. Electrochem. Soc.: Electrochemical Science and Technology, vol. 128, No. 4, (1981) 725-729.

Bourderau, et al., "Amorphous Silicon as a Possible Anode Material for Li-Ion Batteries", Journal of Power Sources, 81-82 (1999) 233-236.

Peng et al., "Uniform, Axial-Orientation Alignment of One-Dimensional Single-Crystal Silicon Nanostructure Arrays", Angew. Chem. Ind. Ed., 44 (2005) 2737-2742.

Peng et al., "Simultaneous Gold Deposition and Formation of Silicon Nanowire Arrays", Journal of Electroanalytical Chemistry, 558 (2003) 35-39.

Canham, L. T., "Diffusion of Li IN Si", Properties of Silicon, EMIS Datareviews Series No. 4 (1987) 454-462.

Qiu et al., "Self-Assembled Growth and Optical Emission of Silver-Capped Silicon Nanowires", Applied Physics Letters, vol. 84, No. 19, (2004) 3867-3869.

Kim et al., "(110) Silicon Etching for High Aspect Ratio Comb Structures", 1997 6th International Conference on Emerging Technologies and Factory Automation Proceedings, (1997) 248-252.

Sharma et al., "Thermodynamic Properties of the Lithium-Silicon System", J. Electrochem. Soc.: Electrochemical Science and Technology, vol. 123 (1976) 1763-1768.

Qiu et al., "From S1 Nanotubes to Nanowires: Synthesis, Characterization, and Self-Assembly", Journal of Crystal Growth, 277 (2005) 143-148.

Tokoro et al., "Anisotropic Etching Properties of Silicon in KOH and TMAH Solutions", Proceedings of the 1998 International Symposium on Micromechatronics and Human Science (1998) 65-70.

Tsuchiya et al., "Structural Fabrication Using Cesium Chloride Island Arrays as a Resist in a Fluorocarbon Reactive Ion Etching Plasma", Electrochemical and Solid-State Letters, 3 (1) (2000) 44-46.

Wagner et al., "Vapor-Liquid-Solid Mechanism of Single Crystal Growth", Applied Physics Letters, vol. 4, No. 5 (1964) 89-90.

Lang, Walter, "Silicon Microstructuring Technology", Materials Science and Engineering, R17 (1996) 1-55.

Liu et al., "Effect of Electrode Structure on Performance of Si Anode in Li-Ion Batteries: Si Particle Size and Conductive Additive", Journal of Power Source, 140 (2005) 139-144.

Wen et al., "Chemical Diffusion in Intermediate Phases in the Lithium-Silicon System", Journal of Solid State Chemistry, 37 (1981) 271-278.

Weydanz et al., "A Room Temperature Study of the Binary Lithium-Silicon and the Ternary Lithium-Chromium-Silicon System for use in Rechargeable Lithium Batteries", Journal of Power Sources, 81-82 (1999) 237-242.

Yan et al., "$H_2$-Assisted Control Growth of Si Nanowires", Journal of Crystal Growth, 257 (2003) 69-74.

Liu et al., "A Novel Method of Fabricating Porous Silicon Material: Ultrasonically Enhanced Anodic Electrochemical Etching", Solid State Communications, 127 (2003) 583-588.

Zhang et al., "Bulk-Quantity Si Nanowires Synthesized by SiO Sublimation", Journal of Crystal Growth, 212 (2000) 115-118.

Wong et al., "Controlled Growth of Silicon Nanowires Synthesized Via Solid-Liquid-Solid Mechanism", Science and Technology of Advanced Materials, 6 (2005) 330-334.

Zhang et al., "Synthesis of Thin Si Whiskers (Nanowires) Using $SiCl_4$", Journal of Crystal Growth, 2006 (2001) 185-191.

Yoshio et al., "Electrochemical Behaviors of Silicon Based Anode Material", Journal of Power Sources, 153 (2006) 375-379.

Zhang et al., "Catalytic Growth of $^x$-$FiSi_2$ and Silicon Nanowires", Journal of Crystal Growth, 280 (2005) 286-291.

Winter, et al., "Insertion Electrode Materials for Rechargeable Lithium Batteries", Advanced Materials, 1998, 10, No. 10.

Kasavajjula et al., "Nano- and Bulk-Silicon-Based Insertion Anodes for Lithium-Ion Secondary Cells", Journal of Power Sources, 163 (2007) 1003-1039.

Peng, et al., "Fabrication of Single-Crystalline Silicon Nanowires by Scratching a Silicon Surface with Catalytic Metal Particles", Adv. Funct. Mater., 16 (2006), 387-394.

Barraclough et al., "Cold Compaction of Silicon Powders Without a Binding Agent", Materials Letters 61 (2007) 485-487.

Ivanovskaya et al., "The Effect of Treatment of Cation-Selective Glass Electrodes With AgNO3 Solution on Electrode Properties", Sensors and Actuators B 24-25 (1995) 304-308.

Peng et al., "Fabrication of Large-Area Silicon Nanowire p-n Junction Diode Arrays", Adv. Mater. (2004), vol. 16, No. 1, 73-76.

Peng et al., "Silicon Nanowires for Rechargeable Lithium-ion Battery Anodes", Applied Physics Letters (2008) vol. 93, No. 3, pp. 33105-1 to 33105-3.

\* cited by examiner

METHOD OF FABRICATING FIBRES COMPOSED OF SILICON OR A SILICON-BASED MATERIAL AND THEIR USE IN LITHIUM RECHARGEABLE BATTERIES

The invention relates to a method of fabricating fibres composed of silicon or a silicon-based material and their use the active anode material in rechargeable lithium battery cells.

It is well known that silicon can be used as the active anode material of a rechargeable lithium-ion electrochemical cell (see, for example, Insertion Electrode Materials for Rechargeable Lithium Batteries, M. Winter, J. O. Besenhard, M. E. Spahr, and P. Novak in Adv. Mater. 1998, 10, No. 10). The basic composition of a conventional lithium-ion rechargeable battery cell is shown in FIG. 1 including a graphite-based anode electrode, the component to be replaced by the silicon-based anode. The battery cell includes a single cell but may also include more than one cell.

The battery cell generally comprises a copper current collector for the anode 10 and an aluminium current collector for the cathode 12 which are externally connectable to a load or to a recharging source as appropriate. A graphite-based composite anode layer 14 overlays the current collector 10 and a lithium containing metal oxide-based composite cathode layer 16 overlays the current collector 12. A porous plastic spacer or separator 20 is provided between the graphite-based composite anode layer 14 and the lithium containing metal oxide-based composite cathode layer 16 and a liquid electrolyte material is dispersed within porous plastic spacer or separator 20, the composite anode layer 14 and the composite cathode layer 16. In some cases, the porous plastic spacer or separator 20 may be replaced by a polymer electrolyte material and in such cases the polymer electrolyte material is present within both the composite anode layer 14 and the composite cathode layer 16.

When the battery cell is fully charged, lithium has been transported from the lithium containing metal oxide via the electrolyte into the graphite-based layer where it reacts with the graphite to create the compound, $LiC_6$. The graphite, being the electrochemically active material in the composite anode layer, has a maximum capacity of 372 mAh/g. It will be noted that the terms "anode" and "cathode" are used in the sense that the battery is placed across a load.

It is generally believed that silicon, when used as an active anode material in a lithium-ion rechargeable cell, provides a significantly higher capacity than the currently used graphite. Silicon when converted to the compound $Li_{21}Si_5$ by reaction with lithium in an electrochemical cell, has a capacity of 4,200 mAh/g.

Existing approaches of using a silicon or silicon-based active anode material in a lithium-ion electrochemical cell have failed to show sustained capacity over the required number of charge/discharge cycles and are thus not commercially viable.

One approach uses silicon in the form of a powder, in some instances made into a composite with optionally an electronic additive and containing an appropriate binder such as polyvinylidene difluoride coated onto a copper current collector. However, this electrode fails to show sustained capacity when subjected to charge/discharge cycles. It is believed that this capacity loss is due to partial mechanical isolation of the silicon powder mass arising from the volumetric expansion/contraction associated with lithium insertion/extraction into and from the host silicon. In turn this gives rise to agglomeration of the powder mass in electrically isolated "islands".

In another approach described by Ohara et al. in Journal of Power Sources 136 (2004) 303-306 silicon is evaporated onto a nickel foil current collector as a thin film and this structure is then used to form the anode of a lithium-ion cell. However, although this approach gives good capacity retention, this is only the case for very thin films and thus these structures do not give usable amounts of capacity per unit area and increasing the film thickness to give usable amounts of capacity per unit area causes the good capacity retention to be eliminated.

In another approach described in US2004/0126659, silicon is evaporated onto nickel fibres which are then used to form the anode of a lithium battery. However this is found to provide an uneven distribution of silicon on the nickel fibres hence significantly affecting operation.

In another approach described in U.S. Pat. No. 6,887,511, silicon is evaporated onto a roughened copper substrate to create medium-thickness films of up to 10 μm. During the initial lithium ion insertion process, the silicon film breaks up to form pillars of silicon. These pillars can then reversibly react with lithium ions and good capacity retention is achieved. However, the process does not function well with thicker film and the creation of the medium-thickness film is an expensive process. Furthermore the pillared structure caused by the break up of the film has no inherent porosity such that issues may arise with long term capacity retention.

The invention is set out in the claims. Because the anode electrode structure uses fibres of silicon or silicon-based material, the problems of reversibly reacting these silicon or silicon-based fibres with lithium are overcome. In particular by arranging the fibres in a composite structure, that is a mixture of fibres a polymer binder and an electronic additive, the charge/discharge process becomes reversible and repeatable and good capacity retention is achieved. In addition the manner in which the fibres are laid can provide advantages. By providing a dis-ordered non-woven mat of fibres, a fully reversible and repeatable charging capability is introduced without risk of significant mechanical isolation. For example the fibres may be deposited as a felt or felt-like structure. In the case of a composite structure this can be with the additional components, or the felt can be with a simple binder or, where structurally appropriate, loose.

Furthermore, a simplified method of fabricating fibres is provided comprising etching a substrate to produce pillars and detaching the pillars providing a robust and high-yield approach.

Embodiments of the invention will now be described, by way of example, with reference to the figures, of which:

Figure 1:
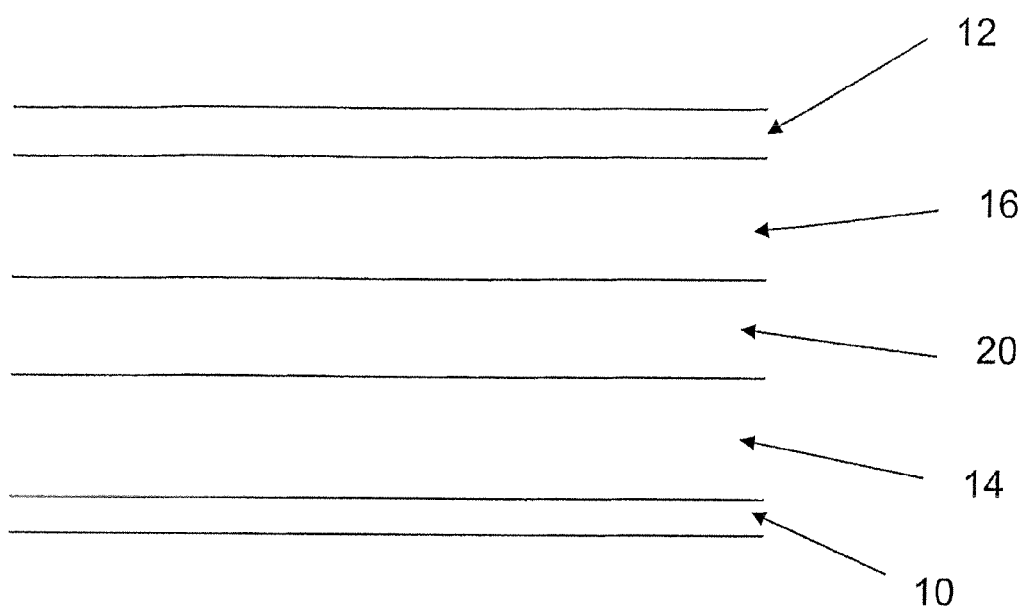
FIG. 1 is a schematic diagram showing the components of a battery cell.

In overview the invention allows creation of fibres or hairs of silicon or silicon-based material and the use of these fibres to create both a composite anode structure with a polymer binder, an electronic additive (if required) and a metal foil current collector and a felt-like electrode structure. In particular it is believed that the structure of the silicon elements that make up the composite overcomes the problem of charge/discharge capacity loss.

By laying down the fibres in a composite or felt or a felt-like structure, that is a plurality of elongate or long thin fibres which crossover to provide multiple intersections, for example by being laid down in a random or disordered or indeed ordered manner, the problem of charge/discharge capacity loss is reduced.

Typically the fibres will have a length to diameter ratio of approximately 100:1 and hence in an anode layer such as a composite anode layer, each fibre will contact other fibres many times along their length giving rise to a configuration where the chance of mechanical isolation arising from broken silicon contacts is negligible. Also, the insertion and removal of lithium into the fibres, although causing volume expansion and volume contraction, does not cause the fibres to be destroyed and hence the intra-fibre electronic conductivity is preserved.

The fibres may be manufactured by detaching pillars from a substrate. In addition the manner of fabrication of the pillars may be provided by a simple repeatable chemical process.

One manner in which the pillars can be made is by dry etching, for example deep reactive ion etching of the type, for example, described in U.S. application Ser. No. 10/049,736 which is commonly assigned herewith and incorporated herein by reference. The skilled person will be familiar with the process such that detailed description is not required here. Briefly, however, a silicon substrate coated in native oxide is etched and washed so as to give a hydrophilic surface. Caesium chloride (CsCl) is evaporated on the surface and the coated substrate is transferred under dry conditions to a chamber of fixed water vapour pressure. A thin film of CsCl develops into an island array of hemispheres whose dimensional characteristics depend on initial thickness, water vapour pressure and time of development. The island array provides an effective mask after which etching is carried out for example by reactive ion etching leaving an array of pillars corresponding to the hemispherical islands. The CsCl resist layer is highly soluble in water and can be readily washed away.

Alternatively the pillars can be made by wet etching/using a chemical galvanic exchange method for example as described in our co-pending application GB 0601318.9 with common assignees and entitled "Method of etching a silicon-based material", incorporated herewith by reference. A related method which may also be used has been disclosed in Peng K-Q, Yan, Y-J Gao, S-P, Zhu J., Adv. Materials, 14 (2004), 1164-1167 ("Peng"); K. Peng et al, Angew. Chem. Int. Ed., 44 2737-2742; and K. Peng et al., Adv. Funct. Mater., 16 (2006), 387-394.

In the preferred embodiment pillars of for example 100 microns in length and 0.2 microns in diameter are fabricated on and from a silicon substrate. More generally pillars of length in the range of 20 to 300 microns and diameter or largest transverse dimension in the range of 0.08 to 0.5 microns may be used to provide the fibres. According to the process the silicon substrate may be n- or p-type and, according to the chemical approach, and may be etched on any exposed (100) or (110) crystal face. Since the etching proceeds along crystal planes, the resulting fibres are single crystals. Because of this structural feature, the fibres will be substantially straight facilitating length to diameter ratio of approximately 100:1 and, when in a composite anode layer, allowing each fibre to contact other fibres many times along their length. The etching process can also be carried out either on very large scale integration (VLSI) electronic grade wafers or rejected samples of the same (single crystal wafers). As a cheaper alternative, photovoltaic grade polycrystalline material, as used for solar panels, may also be used.

In order to detach the pillars to obtain the fibres, the substrate, with pillars attached, is placed in a beaker or any appropriate container, covered in an inert liquid such as ethanol and subjected to ultra-sonic agitation. It is found that within several minutes the liquid is seen to be turbid and it can be seen by electron microscope examination that at this stage the pillars have been removed from their silicon base.

It will be appreciated that alternative methods for "harvesting" the pillars include scraping the substrate surface to detach them or detaching them chemically. One chemical approach appropriate to n-type silicon material comprises etching the substrate in an HF solution in the presence of backside illumination of the silicon wafer.

Once the silicon pillars have been detached they can be used as the active material in a composite anode for lithium-ion electrochemical cells. To fabricate a composite anode, the harvested silicon is filtered from solution and can be mixed with polyvinylidene difluoride and made into a slurry with a casting solvent such as n-methyl pyrrolidinone. This slurry can then be applied or coated onto a metal plate or metal foil or other conducting substrate for example physically with a blade or in any other appropriate manner to yield a coated film of the required thickness and the casting solvent is then evaporated from this film using an appropriate drying system which may employ elevated temperatures in the range of 50 degrees C. to 140 degrees C. to leave the composite film free or substantially from casting solvent. The resulting mat or composite film has a porous and/or felt-like structure in which the mass of silicon fibres is typically between 70 percent and 95 percent. The composite film will have a percentage pore volume of 10-30 percent, preferably about 20 percent.

Figure 2:
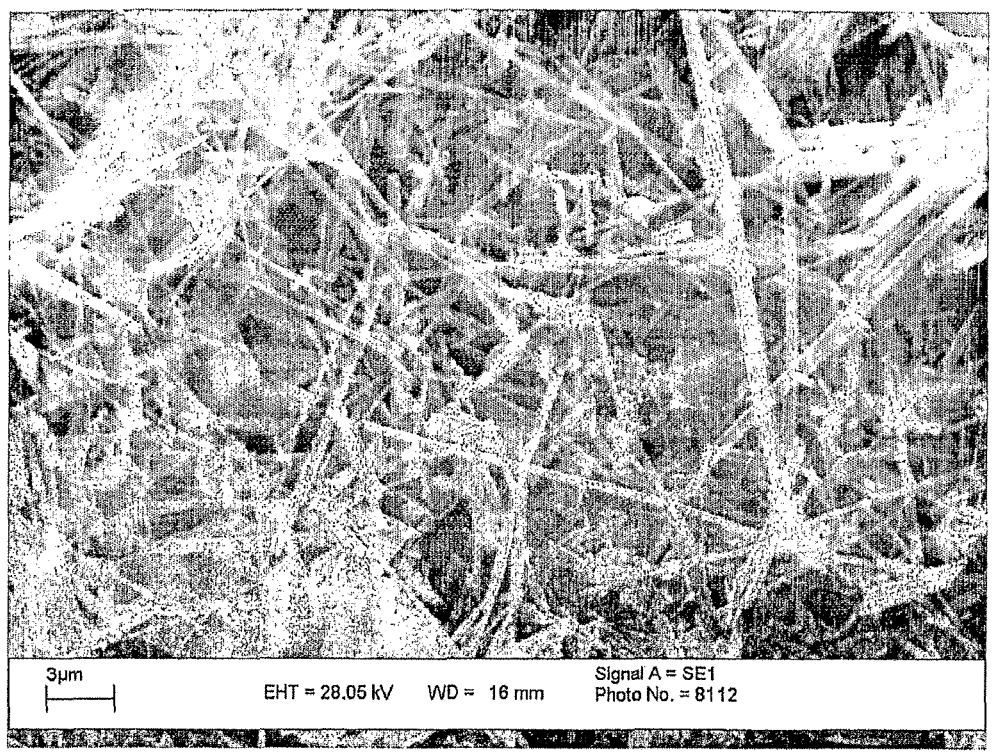
FIG. 2 is a magnified photograph of an electrode according to the present invention.

An SEM of a composite electrode structure obtained by the method set out above is shown in FIG. 2. Alternatively a felt or felt-like structure may be produced as a sheet material (not necessarily on a current collector) and act as its own current collector.

Fabrication of the lithium-ion battery cell thereafter can be carried out in any appropriate manner for example following the general structure shown in FIG. 1 but with a silicon or silicon based active anode material rather than a graphite active anode material. For example the silicon fibres-based composite anode layer is covered by the porous spacer 18, the electrolyte added to the final structure saturating all the available pore volume. The electrolyte addition is done after placing the electrodes in an appropriate casing and may include vacuum filling of the anode to ensure the pore volume is filled with the liquid electrolyte.

Please see the following examples:

0.0140 g of silicon fibres were weighed out into a 2 $cm^2$ Eppendorf centrifuge tube, and 0.0167 g of Super P conductive carbon was added. N-methyl pyrrolidinone (NMP) was then pipetted into the tube, until all the materials were dispersed (0.92 g). Previously, PVDF had been dissolved in NMP, at 7.8 wt % PVDF. A quantity of this solution was added to the tube, containing 0.0074 g of PVDF. The mix composition was thus Si:PVDF:Super P=85.3:4.5:10.1 wt %.

The tube was placed in an ultrasonic bath for one hour, to homogenise the mixture, and then stirred for a further hour. The slurry was then coated onto 14 μm copper foil, using a doctor blade with a blade gap of 0.8 mm. The coating was then dried in an oven at 100° C. for one hour, to evaporate the NMP solvent. After drying, the thickness of the coated layer was 30-40 μm. FIG. 2 shows an SEM of a similar mix and coating, with no Super P carbon.

Figure 3:
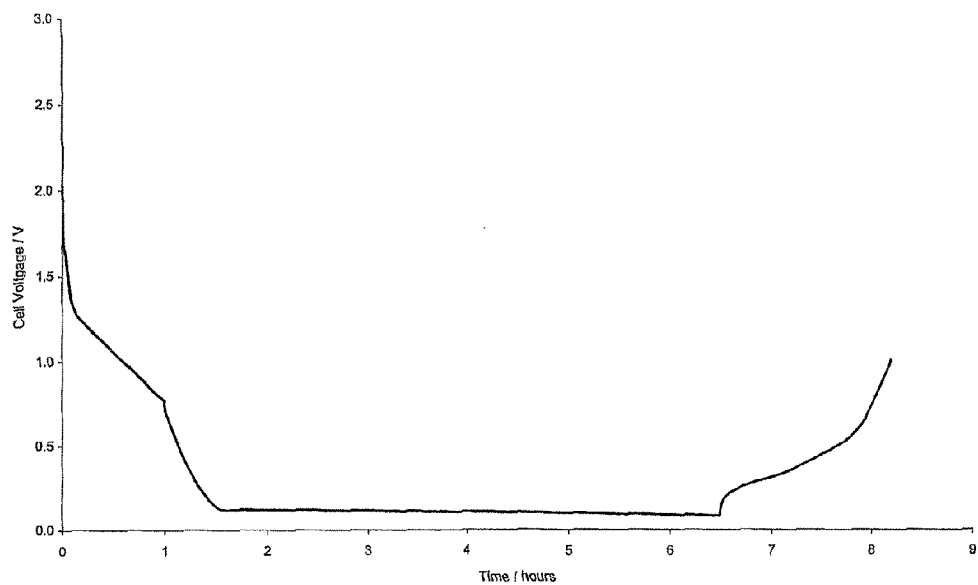
FIG. 3 shows a first cycle voltage plot for a silicon fibre/PVDF/Super P composite electrode.

The coating was lightly rolled, and then electrode disks were cut out with a diameter of 12 mm. These were assembled into electrochemical cells in an argon filled glove box. The counter electrode and reference electrode were both lithium metal. The electrolyte was $LiPF_6$ in a mixture of organic carbonates. The cell was tested on a VMP3 device. After a thirty minute soak, the cell was held at −0.1 mA for one hour, and then at −0.2 mA until the required lithiation capacity was achieved. The electrode was then delithiated at +0.2 mA, up to a voltage of 1.0 V vs. Li/Li$^+$. FIG. 3 shows, the cell voltage during this first cycle.

A particular advantage of the approach described herein is that large sheets of silicon-based anode can be fabricated, rolled if necessary, and then slit or stamped out subsequently as is currently the case in graphite-based anodes for lithium-ion battery cells meaning that the approach described herein can be retrofitted with the existing manufacturing capability.

A further advantage of the arrangement described herein is that the structural strength in fact increases with each recharging operation. This is because the fibres are found to "weld" to one another as a result of the disrupted crystalline structure at the fibre junctions creating an amorphous structure. This in turn reduces the risk of capacity loss over multiple cycles as there is less risk of mechanical isolation of the fibres once the fibres become connected in the manner described above.

It will be appreciated, of course, that any appropriate approach can be adopted in order to arrive at the approaches and apparatus described above. For example the pillar detaching operation can comprise any of a shaking, scraping, chemical or other operation as long as pillars are removed from the substrate to create fibres. Reference to silicon-based material includes silicon where appropriate. The fibres can have any appropriate dimension and can for example be pure silicon or doped silicon or other silicon-based material such as a silicon-germanium mixture or any other appropriate mixture. The substrate from which pillars are created may be n- or p-type, ranging from 100 to 0.001 Ohm cm, or it may be a suitable alloy of silicon, for example $Si_xGe_{1-x}$. The fibres can be used for any appropriate purpose such as fabrication of electrodes generally including cathodes. The cathode material can be of any appropriate material, typically a lithium-based metal oxide or phosphate material such as $LiCoO_2$, $LiMn_xNi_xCo_{1-2x}O_2$ or $LiFePO_4$. The features of different embodiments can be interchanged or juxtaposed as appropriate and the method steps performed in any appropriate order.

The invention claimed is:

1. A method of creating a cell electrode for an electrochemical cell, the method comprising:
    etching a silicon or silicon-based substrate to form fibres;
    detaching the fibres from the substrate;
    depositing a slurry containing a plurality of the fibres to form a layer of fibres;
    wherein at least some of the fibres cross over to provide intersections.

2. A method of creating a cell electrode for a battery, the method comprising:
    etching a silicon or silicon-based substrate, comprising n-type or p-type silicon, to form fibres;
    detaching the fibres from the substrate; and
    forming a layer of fibres in which the fibres cross over each other to provide multiple intersections.

3. A method as claimed in claim 2 in which the fibres have transverse dimensions in the range 0.08 to 0.5 microns.

4. A method as claimed in claim 3 wherein the fibres have a length in the range of 20 to 300 microns.

5. A method as claimed in claim 2 in which the fibres have an aspect ratio greater than 40:1.

6. A method as claimed in claim 2 in which the fibres have a substantially non-circular cross-section.

7. A method as claimed in claim 2 in which the pillars are created by reactive ion etching.

8. A method as claimed in claim 2 in which the pillars are created by chemical reaction etching.

9. A method as claimed in claim 8 in which the pillars are created by galvanic exchange etching.

10. A method as claimed in claim 2 in which the pillars are detached by one or more of scraping, agitating or chemical etching.

11. A method as claimed in claim 2 in which the silicon or silicon-based material comprises one of undoped silicon, doped silicon, or a silicon germanium mixture.

12. A method of creating a cell electrode comprising depositing a slurry containing silicon-based fibres to form a layer of silicon-based fibres, wherein the fibres are formed by the method of claim 2.

13. A method as claimed in claim 12 in which the fibres are deposited in a felt.

14. A method as claimed in claim 12 in which the electrode is a composite electrode comprising at least one of a binder and a conductive additive.

15. The method as claimed in claim 14 wherein the composite electrode has a percentage pore volume of about 10-30 percent.

16. A method as claimed in claim 12 including depositing the fibres on a current collector.

17. A method of fabricating a lithium rechargeable cell comprising the steps of creating an anode as claimed in claim 12 arranging the electrode as an anode and adding a cathode and an electrolyte.

18. A method of fabricating an electrode for an electrochemical cell, the method comprising the steps of:
    etching a silicon substrate or a silicon-based substrate to make pillars;
    detaching pillars from the substrate to give electrode fibres of silicon or a silicon-based material; and
    forming an electrically interconnected mass of electrode fibres, wherein the electrode fibres form an electrochemically active material of the electrode, and the fibres comprise n-type or p-type silicon.

19. A method as claimed in claim 18 in which a mass of silicon in the electrically interconnected mass is 70 to 95 percent.

20. A method as claimed in claim 18 in which the electrically-interconnected mass has a percentage pore volume of about 10-30 percent.

* * * * *